United States Patent
Tanikawa

(10) Patent No.: US 7,759,749 B2
(45) Date of Patent: Jul. 20, 2010

(54) METAL MATERIAL, AND COATING FILM AND WIRING FOR SEMICONDUCTOR INTEGRATED CIRCUITRY UTILIZING THE METAL MATERIAL

(75) Inventor: Akio Tanikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 370 days.

(21) Appl. No.: 11/908,840

(22) PCT Filed: Feb. 7, 2006

(86) PCT No.: PCT/JP2006/302091

§ 371 (c)(1),
(2), (4) Date: Oct. 6, 2007

(87) PCT Pub. No.: WO2006/098101

PCT Pub. Date: Sep. 21, 2006

(65) Prior Publication Data

US 2009/0029126 A1    Jan. 29, 2009

(30) Foreign Application Priority Data

Mar. 16, 2005    (JP) .............................. 2005-074306

(51) Int. Cl.
*H01L 29/78*    (2006.01)
(52) U.S. Cl. .................... 257/416; 257/64; 257/419; 257/420; 257/627; 257/628
(58) Field of Classification Search ................. 257/255, 257/420
See application file for complete search history.

(56) References Cited

U.S. PATENT DOCUMENTS

| 4,112,190 A | 9/1978 | Sato et al. |
| 2004/0099918 A1* | 5/2004 | Noguchi et al. ............. 257/416 |

FOREIGN PATENT DOCUMENTS

| JP | 52155679 | 12/1977 |
| JP | 5198691 | 8/1993 |
| JP | 5320929 | 12/1993 |
| JP | 7252556 | 3/1995 |
| JP | 200238233 | 2/2002 |
| JP | 200351463 | 2/2003 |
| JP | 2004244674 | 9/2004 |

* cited by examiner

*Primary Examiner*—N Drew Richards
*Assistant Examiner*—Kyoung Lee
(74) *Attorney, Agent, or Firm*—Young & Thompson

(57) ABSTRACT

When metallic material is employed for various metallic films, it is possible to improve at least one of the mechanical strength, the durability against abrasion, and the uniformess as a film while keeping unchanged the chemical property and the electric property of the metallic material. Due to the gel three-dimensional mesh structure 406, the dislocations 407 of the tangle in the mesh form are introduced in the crystal of the metal 401 at high density; therefore, when the tensile stress 403 is applied thereto, these dislocations slightly shift. As a result, the metal 401 deforms by uniformly dispersing distortion in the order of crystal grains, and hence there does not occur concentration of stress, which leads to the breakage or the severance at the grain interface 402. Therefore, the metallic material of the present invention improves the mechanical strength and the durability against abrasion.

15 Claims, 2 Drawing Sheets

(a) 211 — INCIDENCE (b) 011 — INCIDENCE

METAL MATERIAL, AND COATING FILM AND WIRING FOR SEMICONDUCTOR INTEGRATED CIRCUITRY UTILIZING THE METAL MATERIAL

TECHNICAL FIELD

The present invention relates to metallic material, and in particular, to metallic material to be used for a metallic coating film employed in semiconductor devices and electronic apparatuses.

RELATED ART

For a metallic film used for various purposes, a function corresponding to the purpose as well as high durability and mechanical strength are required.

For example, for the wiring of a semiconductor integrated circuit, there are employed an aluminum alloy film by a sputtering scheme, a copper film by a plating scheme, and the like. Also, in electric tools such as electrodes and connectors, a coating film of gold, silver, or the like is disposed by a sputtering scheme or a plating scheme with the view of lowering junction resistance; in mechanical parts such as screws and bolds, a coating film of nickel, chromium, or the like is arranged for the purpose of preventing rust. Incidentally, as a technique associated with wiring having high mechanical strength, patent document 1 describes wiring in multilayer structure. Moreover, as techniques applying gel, patent document 2 describes metallic wiring using as an underlay a porous film formed in sol-gel method, and patent document 3 describes metallic parts produced by making metal percolate into a mold, which is created by shaping by a binder obtained by gelated alumina fiber and by hardening (a kind of sol-gel method) thereafter.

Patent document 1: Japanese Patent Laid-open Pub. No. Hei5-198691
Patent document 2: Japanese Patent Laid-open Pub. No. 2003-51463
Patent document 3 Japanese Patent Laid-open Pub. No. Hei7-252556

DISCLOSURE OF THE INVENTION

Problem to be Solved by the Invention

In the conventional metallic film of wiring in semiconductor integrated circuits, the wiring is disconnected and hence reliability of the semiconductor integrated circuits cannot be retained in some cases. Moreover, for the coating film of the electric tools and the mechanical parts, there are required higher mechanical strength and superior durability against abrasion. Also, for these metallic films, there is required a production method to more easily secure uniformess.

The present invention has been devised to meet the requirements and has an object to provide compound metallic material usable for various metallic films and a production method thereof in which while keeping unchanged a chemical property and an electric property of metallic material (metal filled in gaps in a three-dimensional mesh structure), the mechanical strength, the durability against abrasion, and the uniformess as a film are improved. As a result, there is provided wiring which is not easily disconnected and which is superior in the securing of reliability from a viewpoint of the uses for semiconductor integrated circuits, and there is provided a coating film having higher mechanical strength and superior durability against abrasion from a viewpoint of the uses for the coating of electric tools such as connectors and the coating of mechanical parts or optical products.

Means for Solving the Problem

To achieve the objects, there is provided metallic material in accordance with an aspect of the present invention in which gaps of a gel network structure including crystal grains are densely filled up with metal, the crystal grains, in a transmission electron microscope image, being observed to be filled up with moiré patterns which are amorphously subdivide and which have variable intervals and angles.

Moreover, the interval between the moiré patterns may be set to 10 nanometers (nm) or less and the mean size of the subdivided areas is set to 50 nm or less. The network structure is a three-dimensional mesh structure formed through crosslinking or tangling of polymer in which atoms or molecules (monomer) are chained with each other in a one-dimensional way. The crystal lattice of metal densely filled in gaps in the gel network structure shifts for each gap due to the one-dimensional polymer molecules and is distorted. Therefore, in a transmission electron microscope image, there is observed as if the crystal grains are filled up with moiré patterns which are amorphously subdivide and which have variable intervals and angles.

According to these metallic materials, while keeping unchanged the chemical property and the electric property of metal filled in gaps in the three-dimensional mesh structure (to be referred to as metal filled therein or metal to be filled therein depending on cases.), the mechanical strength and the durability against abrasion are improved.

Additionally, according to these metallic materials, the density of the metallic material in the three-dimensional mesh structure can be uniformly controlled with satisfactory reproducibility through (i) selection of the kind of gel used for the three-dimensional mesh structure, (ii) selection of a method to produce the three-dimensional mesh structure, (iii) adjustment of the amount of the solvent contained in the gel formed on a substrate in the production process of the three-dimensional mesh structure. As a result, it is possible to control the dislocation density of the filled-in metal and to uniformly introduce dislocation of metal with satisfactory reproducibility.

Furthermore, according to (iii) adjustment of the amount of solvent, the ratio in terms of volume or weight of the three-dimensional mesh structure to the solvent can be set to one percent or less and hence the amount of the three-dimensional mesh structure relative to the metal to be filled therein can be precisely adjusted. Therefore, the three-dimensional mesh structure becomes impurity and it is hence possible to prevent change in the chemical property such as resistivity against medicines and the electric property such as electric resistance of the metal filled therein. Resultantly, it is possible to easily produce metallic material which has high mechanical strength and superior durability against abrasion while keeping unchanged the chemical property and the electric property of the filled-in metal.

Incidentally, the ratio in terms of volume of the three-dimensional mesh structure to the solvent in the description is a value obtained by dividing the difference between the volume of the gel including the solvent and the volume of only the solvent in the situation (the volume of the three-dimensional mesh structure of the gel) by the volume of the gel including the solvent. Also, the ratio in terms of weight of the three-dimensional mesh structure to the solvent in the description is a value obtained by dividing the weight (the weight of the three-dimensional mesh structure of the gel) of the gel from which the solvent is dried up (to be called dried gel) by the sum of the weight of the dried gel and that of the solvent. In this situation, it is assumed that the solvent is water; if the solvent is other than water, the calculation is conducted by replacing the weight of the solvent by the weight of water of the same volume of the solvent.

According to the metallic material of the present invention, there can be obtained a metallic film that has high mechanical strength and superior durability against abrasion while keeping unchanged the chemical property and the electric property of the filled-in metal. For example, when the metallic material is employed for the wiring in semiconductor integrated circuits, the wiring is not easily disconnected, and hence highly reliable semiconductor integrated circuits are obtained. In addition, when the metallic material is employed for the coating film of mechanical parts or the like, there is produced a coating film which has high mechanical strength and high durability against abrasion and which is not easily peeled off from the substrate.

According to the metallic material of the present invention, while keeping unchanged the chemical property and the electric property of metal filled in gaps in the three-dimensional mesh structure (to be referred to as metal filled therein or metal to be filled therein depending on cases.), the mechanical strength and the durability against abrasion are improved.

The network (three-dimensional mesh structure) of gel is formed through the crosslinking or tangling of polymer in which atoms or molecules (monomer) are chained with each other in a one-dimensional way. The crystal lattice of the metal densely filled in gaps in the network structure of the gel shifts for each gap by one-dimensional polymer molecules and is hence distorted. Therefore, the material is observed in a transmission electron microscope image to be filled up with moiré patterns which are amorphously subdivided and which have variable intervals and angles. It is a feature of the metallic material of the present invention that although the gel network itself is not observed, the material is filled up with moiré patterns which are amorphously subdivided and which have variable intervals and angles; therefore, it can be identified that the gel in which the gel network is filled in the metal or the gel in which the gel network was filled in the metal has denatured.

The mechanical strength and the durability against abrasion are improved while keeping unchanged the chemical property and the electric property of metal filled in gaps in the three-dimensional mesh structure of the gel because dislocation or a lattice defect structure which may become a dislocation source can be introduced into the crystal lattice of the filled-in metal centered on a one-dimensional chain (formed through the chaining of one-dimensional coupling of gel atoms or molecules) of gel forming the three-dimensional mesh structure, not because impurity atoms are simply added to the metal. That is, the crystal of the filled-in metal is in the state in which the dislocation of the tangling or tangle in the mesh form is introduced at high density, and the dislocation exerts two actions as below, and hence the above effect is attained.

First, the first action will be described.

In the metallic material of the present invention, since the dislocation of the tangle in the mesh form is introduced in the crystal of the metal at high density, the lattice defect of the metal changes in the order of nanometer and hence the lattice distortion is not uniform in this state. In general, when external force is applied onto metal, atoms of the metal are going to diffuse; however, in the metallic material of the present invention, the non-uniform lattice distortion bents the diffusion paths of metallic atoms in a complex way. As a result, the speed of plastic deformation due to the self-diffusion of the filled-in metal is lowered, and hence the mechanical strength and the durability against abrasion are improved.

Next, the second action will be described by referring to drawings.

In general, as FIG. 1(a) shows, when tensile stress 403 is applied to metal 401, dislocation 405 included in the crystal of the metal is brought into activity, and hence stress is concentrated onto an interface 402 between grains of the metal 401 and a void (crack) 404 grows. Therefore, breakage and severance easily occur in the conventional metal 401, which hence has low mechanical strength. On the other hand, in the metallic material of the present invention, as FIG. 1(b) shows, since the dislocation 407 of the tangle in the mesh form is introduced in the crystal grains of the metal 401 at high density due to the three-dimensional mesh structure 406 of gel, when the tensile stress 403 is applied thereto, these dislocations slightly shift. As a result, the metal 401 deforms by uniformly diffusing the distortion in the order of the crystal grain, and hence there does not occur the concentration of stress at the interface 402 between grains, the concentration of stress causing the breakage or the severance. Therefore, the mechanical strength and the durability against abrasion are improved in the metallic material of the present invention. Incidentally, in FIG. 1, the three-dimensional mesh structure 406 is shown by solid lines and the mesh structure 407 of the dislocation is shown by broken lines. Also, in the present specification, "dislocation" is a kind of lattice defect and indicates a dislocation of a string of atoms occurring along a line (dislocation line) in the crystal.

Furthermore, according to the metallic material of the present invention, thanks to the two actions, when the metallic material is formed into a metallic film on a substrate, the interface stress between the metallic film and the substrate can be mitigated, and hence the metallic material becomes a metallic film (coating film) which cannot be easily peeled off from the substrate.

According to the method of producing the metallic material of the present invention, various effects are obtained through (iii) adjustment of the amount of the solvent described above. For example, when the ratio in terms of volume or weight of the three-dimensional mesh structure to the solvent is adjusted to 10% or less, the change in the electric property of the filled-in metal can be sufficiently suppressed. Also, when the ratio in terms of volume is adjusted to 5% or less, the change in the tone of color of the filled-in metal can be sufficiently suppressed. Furthermore, when the ratio in terms of volume is adjusted to 20% or less, it can be easily conducted in an operation to fill metal in gaps of the three-dimensional mesh structure using the plating scheme to densely fill the metal therein. Additionally, when the ratio in terms of volume is adjusted to 2% or less, in an operation to fill metal in gaps of the three-dimensional mesh structure using a physical vapor deposition scheme, e.g., the sputtering scheme or the evaporation scheme, it can be easily conducted to densely fill the metal therein.

Moreover, through (iii) adjustment of the amount of the solvent described above, the size of the mesh of the three-dimensional mesh structure can be adjusted in a range from several nanometers to several tens of nanometers, which can implement both of the sufficient strength and the function according to the purpose.

Furthermore, according to the method of producing the metallic material of the present invention, since coarseness of the surface of the substrate on which the metallic material is constructed and the convection of the plating solution and the raw material gas due to the concentration of electric fields, the temperature difference, or the like are suppressed by the three-dimensional mesh structure, the obtained metallic material has uniform thickness. Therefore, when such metallic material is employed for various metallic films, there is also obtained an effect of improving the uniformess of the films.

Effect of the Invention

In accordance with the present invention, when the metallic material is employed for various metallic films while keeping unchanged the chemical property and the electric property of the metallic material, it is possible to improve at least one of the mechanical strength, the durability against abrasion, and the uniformess as films.

EXEMPLARY EMBODIMENTS

The metallic material of the present invention is suitably used as wiring of semiconductor integrated circuits or coating films of electric tools, mechanical parts, or optical parts.

In the method of producing the metallic material of the present invention, the effect is not lost even if (1) a process to remove part of the three-dimensional mesh structure is disposed before the process to fill in the metal, (2) a process to denature part of the three-dimensional mesh structure is disposed after the process to fill in the metal, and (3) a process to carbonize part of the three-dimensional mesh structure is disposed after the process to fill in the metal when the gel is formed using an organic material.

Next, description will be given of the metallic material and the production method of the material according to the present invention by referring to drawings.

FIG. 2 is a schematic cross-sectional view showing an example of the metallic material of the present invention. The metallic material of the present invention is configured by filling metal 103 in gaps in a (three-dimensional) mesh structure 102 of gel. That is, when the configuration of metallic material of the present invention is viewed from another viewpoint, the three-dimensional mesh structure 102 of gel is disposed in a film of the metal 103 in the construction. Moreover, although the mesh structure 102 is disposed throughout the film of the metal 103, the structure 102 does not mechanically support the film of the metal 103 from the inside.

FIG. 3 is a schematic diagram showing an example of the metallic material of the present invention. By producing a foil of the metallic material to observe the foil by a transmission electron microscope, there is often observed crystal grains filled up with moiré patterns 202 which are amorphously subdivided and which have variable intervals and angles as shown in FIG. 3. The subdivided area in the area occupied by the moiré patterns 202 has a size 203 corresponding to width of a gel network 201 subdividing the moiré patterns 202, and the mean size thereof is 50 nm or less and favorably ranges from two nanometers to 50 nm. The interval of the moiré patterns 202 caused by the overlapping of shifted crystal lattices does not exceed ten nanometers. Although the moiré pattern 202 is absent from some boundary areas, the width of the area is less than the size of the moiré area. This is because the crystal lattices having structure in which metal is densely filled in gaps in the gel network structure 201 are shifted in slightly different angles for respective gaps by the one-dimensional polymer molecules and hence are distorted. That is, if two or more gel gap areas exist in the direction of incidence of electrons of the transmission electron microscope, there are observed moiré patterns by the overlapping of the shifted lattices. These moiré patterns are amorphously subdivided according to a size matching the size of the mesh of the three-dimensional mesh structure of gel; the interval and the angle of the moiré patterns are variable and are fluctuating because the shift of crystal lattices is variable in the mesh. The transmission electron microscope image filled up with the moiré patterns which are amorphously subdivided and which have variable intervals and angles as above is observed throughout the area of crystal grains matching the conditions of the crystal orientation and thickness. This is a feature which is observed only for the metallic material of the present invention.

The moiré patterns described above are caused by shifted crystal lattices, by neither composition and a phase change, nor fringes of equal thickness, nor curved interference fringes. For these, even if the orientation is changed, the fringe itself does not disappear. Also, although the stacking fault causes patterns of fringes by shifting crystal lattices, the area is discrete and shows a polygonal form such as a triangle or a hexagon; moreover, the fringes are equally separated from each other in many cases and are linear, and hence these can be discriminated based on the different points. Additionally, the gel network structure shows amorphous shapes irrespective of crystal lattices unless a fine periodic structure is intentionally constructed, and hence the shapes of subdivided areas subdivided by the gel network structure are amorphous. Furthermore, since the direction of the one-dimensional polymer molecules constituting the gel network structure is also determined irrespective of the crystal lattices, the magnitude and the angle of distortion accordingly caused in the crystal lattices of the metal are variable and hence the interval and the angle of moiré patterns are variable and fluctuate.

Incidentally, the metallic material of the present invention is produced in a first production method in which a three-dimensional mesh structure including solvent in gaps is constructed by forming gel including a three-dimensional mesh structure on a substrate, and then a metallic material is produced by filling metal in the gaps by replacing the solvent with the metal using the plating scheme and a second production method in which a three-dimensional mesh structure including solvent in gaps is constructed by forming gel including a three-dimensional mesh structure on a substrate, the solvent is dried up by supercritical drying or the like to construct a three-dimensional mesh structure in which the gaps are not crushed and which does not include the solvent, and a metallic material is produced by filling metal in the gaps by the chemical vapor deposition method or the physical vapor deposition method. The substance including only the three-dimensional mesh structure in which the gaps are not crushed and which does not include the solvent is called aerogel.

Incidentally, when colloid solution is heated or cooled, the solution loses its fluidity and solidifies (grains connect to each other to form a three-dimensional mesh structure) depending on cases. The state in which the solution has lost the fluidity is generally called gel. When water is forcibly removed from the gel, there remains a porous structure in which grains are crushed to be fixed to each other. Although this is also called a three-dimensional mesh structure, this is not included in the definition of gel in the present specification.

That is, the gel in the present specification is a substance that has a three-dimensional mesh structure constructed by a one-dimensional chain of atoms or molecules (a chain formed by one-dimensional coupling of atoms or the like) and which includes solvent in gaps therein. Moreover, the gel also includes a substance including a structure in which such one-dimensional chain of atoms or molecules and another one-dimensional chain form a crosslink, the substance including solvent in gaps therein.

That is, in accordance with the present invention, the three-dimensional mesh structure of gel includes a structure including a crosslink structure and a structure not including the crosslink structure. Additionally, even if the structure does not include the crosslink structure, it may be a structure in which one-dimensional chains intersect each other. However, the three-dimensional mesh structure in the present specification must absolutely include the one-dimensional chain of atoms or molecules. In other words, the gel of the present invention does not include a structure in which porous materials and grains couple with each other even if the raw material is gel. In particular, porous material obtained by the sol-gel scheme in which solid matter is produced by hardening gel is only porous solid matter, which can not be used in the present invention at all. Also, if the one-dimensional chain of atoms or molecules is widely interpreted, there is also included so-called fiber; however, to obtain the effect of the present invention, it is required that the one-dimensional chain of atoms or molecules (if chains constitute a bundle, one of the chains of the bundle) has a diameter (thickness) of 20 nanometers or less and ten nanometers or less to attain an explicit effect.

In the first production method described above, as a plating scheme employed to fill metal in the gaps in the three-dimensional mesh structure, there may be considered an electrolytic plating scheme or an electroless plating scheme; and from a viewpoint of the densely filling in of metal, it is favorable to apply the electrolytic plating scheme.

Metal filled in by applying the plating scheme may have a multilayer structure of a plurality of kinds of metals. In this case, it is easily constructed by soaking a substrate on which the three-dimensional mesh structure is formed in plating solution of a desired metal and thereafter by soaking the substrate in plating solution of another metal.

After the metal is filled in the gap in the three-dimensional mesh structure as above, it is favorable to remove excessive gel according to necessity. For example, after a slightly thicker gel is formed and the metal is filled therein with a required thickness, the gel in which the metal is not filled is removed. As a method to remove the gel, there may be employed a method to conduct chemical-mechanical polishing or to conduct washing by use of a jet water stream or water at 80° C. or higher. Also, by the chemical-mechanical polishing, it is possible to remove an excessive portion of the filled-in metal together with the excessive gel.

The solvent in the three-dimensional mesh structure of gel formed on the substrate in the second production method is dried not to crash the three-dimensional mesh structure of gel. As such drying method, an ultra-critical drying method, a freeze-drying method, or the like is applicable; the ultra-critical drying method is favorable from the viewpoint that the three-dimensional mesh structure is not crashed. The ultra-critical drying method is a method to dry the solvent under a condition equal to or more than a critical temperature and a critical pressure; since the surface tension of the solvent is zero, the solvent is dried without crashing the three-dimensional mesh structure.

As material gases employable in the Chemical Vapor Deposition method (CVD method), there may be used inorganic metal compounds such as wolfram halide and organic metal compounds such as trimethylaluminum generally used in the CVD method. Furthermore, as the Chemical Vapor Deposition method, the thermal CVD method, the plasma CVD method, or the optical CVD method is available; and as the method and conditions thereof, those generally known are available. Incidentally, when metal is filled in by use of the thermal CVD in the metallic material production process, it is desirable to select from the gel materials, a gel material having heat resistance against the metal growing temperature.

Additionally, in place of the CVD method, the physical vapor deposition method is also available; as the filling-in of metal in the physical vapor deposition method, there may be employed the metal filling-in of the sputtering method and that of the evaporation method. In a case wherein the metal is filled in by use of the sputtering method or the evaporation method, in order to enable to densely fill in the metal, it is favorable that a metal which easily diffuses on the substrate surface is selected as the metal to be filled in and the thickness of the metal is set to a low value. Moreover, when the sputtering method or the evaporation method is employed, although it is considered that material atoms of the metal undergone the sputtering or the like are fixed, before arriving at the substrate, onto the three-dimensional mesh structure and the filling-in of the metal is slightly deteriorated, the metal is densely filled in the gaps in the three-dimensional mesh structure if the filling-in is carried out under the condition described above.

Application Example

Referring to drawings, description will be given of an application example of the present invention.

FIG. 4 shows as a specific example of application of a metallic material of the present invention, a transmission electron microscope image of a film in which agarose gel is buried in copper to be used for wiring of a semiconductor integrated circuit (LSI). FIG. 4(a) is an image of one crystal grain with an electron beam incidence orientation <211>, namely, an orientation vertical to the sheet of paper and the thickness condition is satisfied. The crystal orientation in a plane is indicated by an arrow mark drawn on the left side. Moiré fringes appearing under this condition are about in the <011> direction (a general term including all orientations which include the <011> orientation and the orientations equivalent to the <011> orientation; this also applies to the description hereinbelow); and are caused by the shift of the lattice image corresponding to the {022} lattice plate having an interval which is one half of the {011} lattice plane vertical to the moiré fringes (a general term including all planes which include the (001) plane and the planes equivalent to the pertinent lattice plane; this also applies to the description hereinbelow). The film includes crystal grains observed as if the grains are filled up with moiré patterns which are amorphously subdivided and which have variable intervals and angles; and for other crystal grains, there are observed moiré patterns of different patterns. FIG. 4(b) is an image of another crystal grain with an electron beam incidence orientation <011>, namely, an orientation vertical to the sheet of paper and the thickness condition is another appropriate condition. Moiré patterns appear in two directions of a crystal orientation <111> in a plane indicated by an arrow mark drawn on the left side, and resultantly, there appear zigzag patterns. In this case, lattice images corresponding to the {111} lattice plane form moiré patterns. In the case described above, any subdivided area has a size of about ten nanometers and the moiré interval ranges from one nanometer to two nanometers. Furthermore, FIG. 4 includes a large number of contrasts 301, 302, and 303.

Incidentally, the metallic material based on copper in the specific example of the present invention does not show any change after 30-minute heat treatment at 350° C. In a case wherein the copper film containing the three-dimensional mesh structure of the gel is used to form LSI wiring, the disconnection ratio due to stress migration and electromigration can be reduced to 1/1000 as compared with the conventional copper wiring.

The film including the copper-based metallic material is produced as follows. First, in a pre-process of the electrolyte plating, a sputtered copper film having a thickness of about 100 nm is deposited on a silicon wafer. The wafer surface is dipped in 0.8 wt. % agarose aqueous solution heated up to 80° C. and is then immediately placed in cool water to coat the surface with 10 micrometer (μm) thick gel. The wafer is directly soaked in copper electrolyte plating solution to grow a copper film with a thickness of 50 nm or more, and then excessive agarose gel is removed using water at a temperature of 80° C. or more. A cross-sectional sample of the film is produced through mechanical polishing and ion milling and is observed by a transmission electron microscope.

As application examples of the present invention, there are considered, in addition to the semiconductor integrated circuit of the specific example above, many applications such as a coating film inside a mirror cylinder in which a lens as an optical part is mounted, a surface layer of a gasket made of metal as an electric tool, and a coating film of a blade of a razor as a mechanical part.

Furthermore, for the obtained metallic material, part of the three-dimensional mesh structure may be removed or denatured. For example, in a case wherein the metallic material is employed as a coating film of parts or the like in a high-vacuum apparatus, to prevent the gel constituting the three-dimensional mesh structure from contaminating the inside of the apparatus, it is possible to remove or to regenerate the three-dimensional mesh structure exposed to the surface of the compound metallic material. As a method to remove part of the three-dimensional mesh structure, there can be considered, for example, a method to remove a fixed depth of the three-dimensional mesh structure from the surface of the metallic material by an etching process, an oxygen plasma process, or the like. Also, as a method to regenerate part of the three-dimensional mesh structure, there can be considered, for example, a method to cause, by heat treatment, reaction between the three-dimensional mesh structure of the gel and the metal existing in the vicinity of the surface of the metallic material. Even for the metallic material in which the three-dimensional mesh structure to be a core as above is lost, since the configuration of dislocation is retained in the filled-in metal, the effects of the mechanical strength, the durability against abrasion, the resistivity against peel-off, and the like are kept unchanged.

The gel available in the embodiment includes gel of natural material and gel of synthetic material as shown in Table 1; either gel includes the three-dimensional mesh structure and is favorably used as material including solvent in gaps.

TABLE 1

| Primary category | Secondary category | | Examples of material | |
|---|---|---|---|---|
| Natural material | Polysaccharide gel | Seaweed polysaccharides | Galactoses (carageenan, agarose, etc.), Alginic acid | β-D-galactose, Anhydro-α-D-galactose, Anhydro-α-L-galactose, β-D-mannuronic acid, α-L-guluronic acid |
| | | Plant polysaccharides | Pectin, Konnyaku mannan, Locust bean gum, Cyamoposis gum | Protopectin, Pectic acid, Pectinic acid (α-D-galacturonic acid), β-D-glucose, β-D-mannose, α-D-galactose |
| | | Microbe polysaccharides | Gellan gum, Xanthan gum, Curdlan, Amino acid gel | Linear glucan, β-D-glucose, β-D-glucuronic acid, α-L-rhamnose, Mannose, Poly(γ-glutamine), Poly(ε-lysine) |
| | Protein gel | | Protein in general (gelatin, white of boiled egg, tofu, etc.) | |
| | DNA gel | | DNA, RNA | |
| Synthetic material | Inorganic gel | Oxides | Silica gel, Alumina gel, Titania gel | |
| | | Salts of metal | Nitrate | |
| | | Nanotubes | Carbon nanotube gel, Boron nitride nanotube gel | |
| | Organic gel | Salts of organic acid | Acetate, Salt of ethylhexanoic acid, Salt of neodecanoic acid, Salt of octanoic acid | |
| | | Organic metals | Alkoxide (methoxide, ethoxide, butoxide, propoxide, isopropoxide, methoxyethoxide, etc.), Acethylacetonate | |
| | | Crosslinked polymer | Polyvinyl alcohol, poly acrylic acid, Acrylamide, Silicone, Polyurethane, Polyethylene oxide, Polyethylene glycol | |

As the gel of natural material, there can be considered gel of polysaccharides, gel of protein, or DNA gel. Also, there may be used gel including constituents extracted therefrom or the like. The gels of polysaccharides include gel material such as seaweed polysacharides, plant polysacharides, or microbe polysaccharides.

As the gel materials of seaweed polysaccharides, there may be considered galactoses (carageenan, agarose, etc.) or alginic acid including, as a primary component, β-D-galactose, anhydro-α-D-galactose, anhydro-α-L-galactose, β-D-mannuronic acid, or α-L-guluronic acid.

As the gel materials of plant polysaccharides, there can be considered pectin, Konnyaku mannan, locust bean gum, and cyamoposis gum including, as a primary component, protopectin, pectic acid, pectinic acid (α-D-galacturonic acid), β-D-glucose, β-D-mannose or α-D-galactose.

As the gel materials of microbe polysaccharides, there can be considered gellan gum, xanthan gum, curdlan, and amino acid gel including, as a primary component, linear glucan, β-D-glucuronic acid, α-L-rhamnose, mannose, poly(γ-glutamine), or poly(ε-lysine).

As the gel materials to construct protein gels, there can be considered polymer materials of protein in general such as gelatin, the white of a boiled egg, or the like.

As gel materials to constitute DNA gel, DNA or RNA are available.

As the gels of synthetic materials, there can be employed inorganic gels produced using gel materials such as oxides, salts of metal, or nanotubes or organic gels produced using gel materials such as salts of organic acids, organic metals, or crosslinked polymer.

As the gels produced using gel materials of oxides, there can be considered silica gel, alumina gel, or titania gel. As materials to produce silica gel, tetra methoxy silane is available.

As the gel materials of metallic salts, nitrate is available.

As the gel materials of nanotubes, carbon nanotube or boron nitride tube is available.

As the gel materials of salts of organic acid, there can be considered acetate, salt of ethylhexanoic acid, salt of neodecanoic acid, or salt of octanoic acid.

As the gel materials of organic metals, there can be considered alkoxide (methoxide, ethoxide, butoxide, propoxide, isopropoxide, or methoxyethoxide) or acethylacetonate; for example, copper methoxide and the like are available.

As the gel materials of crosslinked polymer, there can be considered polyvinyl alcohol, poly(acrylic acid), acrylamide, silicone, polyurethane, polyethylene oxide, or polyethylene glycol.

The gel to be used as the three-dimensional mesh structure may be gels other than gels exemplified above, and various gels are available.

Furthermore, gel molecules as the gel materials may be modified by atoms or molecules of an additive with the aim of positively developing the effect of the additive.

The coating film of the metallic material of the embodiment formed on the substrate is obtained by applying, on the substrate, dispersing solution attained by dispersing gel material in appropriate solvent, and then by filling metal therein using the plating scheme.

Here, the solvent is required only to disperse the gel material, and for example, organic solvent such as water or methanol is available. Incidentally, "dispersion" here includes both of mixing or dissolution.

Moreover, as the method of applying the dispersing solution, there may be employed various applying methods such as a dip method to dip the substrate in the dispersing solution, a spray method, and a spin coating method. In this connection, the substrate (base member) is a to-be-processed substrate (base member) on which the metallic material is formed as a metallic film; for example, when the metallic material is used as wiring, a semiconductor integrated circuit substrate is the substrate here; when the metallic material is used as various coating films, each of the electric tools or the like to be coated with the film is the base member.

The production of gel on the substrate (base member) is carried out using a method according to the kind of gel material employed in which a crosslinking agent is added to the dispersing solution or the dispersing solution applied onto the substrate (base member) is cooled or heated to conduct gelatin (crosslinking). For example, in a case wherein tetra methoxy silane is adopted as the gel material, water is added thereto as an additive for gelatin by hydrolysis reaction and polymerization reaction; when polyvinyl alcohol is employed as the gel material, aqueous solution of boric acid is added as a crosslinking agent to conduct the gelatin. Moreover, when agarose is utilized, the gelatin is performed by cooling the dispersion solution applied onto the substrate (base member).

Metals which can be filled in using the plating scheme are, for example, pure metals including Ag, Au, Cd, Co, Cr, Cu, Fe, Ni, Pb, Pd, Pt, Rh, Ru, Si, Sn, or Zn; alloys including Ag—Cd, Ag—Co, Ag—Cu, Ag—Sn, Ag—Zn, Al—Mn, Au—Cu, Au—Ni, Au—Pd, Au—Sn, Cd—Sn, Cd—Zn, Co—Cu, Co—Fe, Co—Mo, Co—Ni, Co—Sn, Co—W, Cr—H, Cu—Ni, Cu—Pb, Cu—Sb, Cu—Sn, Cu—Zn, Fe—Mo, Fe—Ni, Fe—W, Fe—Zn, In—Sn, Ni—B, Ni—Mo, Ni—P, Ni—S, Ni—Sn, Ni—W, Ni—Zn, or Sn—Zn; and compounds such as MgO or SnO2; the metal to be filled in is selected from these metals and the like according to various purposes of the use of metallic materials.

As the plating solution, there is employed aqueous solution of sulfate, salt of sulfide, or pyrophosphate of the metal to be filled in or solution of organic solvent including ethanol of salt thereof, N-methylformamide, formamide, acetone, ethyl acetate, benzene, dimethylsulfoxide, N-dimethylformamide, acetonitrile, pyridine, tetrahydrofuran, or di-n-butyl ether.

As the plating solution, there can be specifically employed those shown in Table 2. That is, as the Ag plating solution, a silber iodide bath: AgI (0.05 mol/L)+KI (2 mol/L) is available; as the Au plating solution, there can be used a cyanogen bath: $KAu(CN)_2$ (0.05 mol/L), a sulfurous acid bath: $Na_3Au(SO_3)_2$ (0.05 mol/L), or a chloroaurate bath: $HAuCl_4$ (0.02 mol/L) is available. Furthermore, as the Cr plating solution, a Sargent bath: $CrO3$ (2.5 mol/L)+$H_2SO_4$ (0.025 mol/L) is available; as the Cu plating solution, a Cu sulfate bath: $CuSO_4.H_2O$ (1.0 mol/L) or a pyrophosphoric acid bath: $CuP_2O_7.3H_2O$ (0.2 mol/L)+$KP_2O_7.3H_2O$ (0.7 mol/L) is available. Additionally, as the Fe plating solution, a sulfuric acid bath: $FeSO_4$ (1.0 mol/L)+$H_3BO_3$ (0.5 mol/L), a chloride bath: $FeCl_2$ (1.0 mol/L)+$H_3BO_3$ (0.5 mol/L), or a sulfaminic acid bath: $Fe(S_2NH_2)_2$ (1.0 mol/L)+$HFNH_4$ (0.1 mol/L) is available. Moreover, as the Ni plating solution, a sulfrate bath: $NiSO_4$ (1.0 mol/L)+$H_3BO_3$ (0.5 mol/L), a chloride bath: $NiCl_2$ (1.0 mol/L)+$H_3BO_3$ (0.5 mol/L), a Watt bath: $NiSO_4$ (0.9 mol/L)+$NiCl_2$ (0.09 mol/L)+$H_3BO_3$ (0.5 mol/L), or a sulfamine acid bath: $Ni(S_2NH_2)_2$ (1.0 mol/L)+$H_3BO_3$ (0.5 mol/L) is available. As specific examples of alloy plating solution, there can be employed, as the Ag—Sn alloy plating solution, AgI (0.02 mol/L)+$SnCl_2.2H_2O$ (0.18 mol/L)+KI (2 mol/L)+$K_4P_2O_7$ (0.54 mol/L) is available; as the Cu—Sn alloy, there can be used $SnSo_4$ (X mol/L)+$CuSO_4$ (0.5 mol/L)+cresolsulfonic acid (0.25 mol/L).

TABLE 2

| Metal | Plating solution example |
|---|---|
| Ag | Silber iodide bath: AgI (0.05 mol/L) + KI (2 mol/L) |
| Au | Cyanogen bath: $KAu(CN)_2$ (0.05 mol/L) |
| | Sulfurous acid bath: $Na_3Au(SO_3)_2$ (0.05 mol/L) |
| | Chloroaurate bath: $HAuCL_4$ (0.02 mol/L) |
| Cr | Sargent bath: $CrO_3$ (2.5 mol/L) + $H_2SO_4$ (0.025 mol/L) |
| Cu | Sulfuric acid bath: $CuSO_4 \cdot H_2O$ (1.0 mol/L) |
| | Pyrophosphoric acid bath: $CuP_2O_7 \cdot 3H_2O$ (0.2 mol/L) + $KP_2O_7 \cdot 3H_2O$ (0.7 mol/L) |
| Fe | Sulfuric acid bath: $FeSO_4$ (1.0 mol/L) + $H_3BO_3$ (0.5 mol/L) |
| | Chloride bath: $FeCl_2$ (1.0 mol/L) + $H_3BO_3$ (0.5 mol/L) |
| | Sulfamic acid bath: $Fe(S_2NH_2)_2$ (1.0 mol/L) + $HFNH_4$ (0.1 mol/L) |
| Ni | Sulfuric acid bath: $NiSO_4$ (1.0 mol/L) + $H_3BO_3$ (0.5 mol/L) |
| | Chloride bath: $NiCl_2$ (1.0 mol/L) + $H_3BO_3$ (0.5 mol/L) |
| | Watt bath: $NiSO_4$ (0.9 mol/L) + $NiCl_2$ (0.09 mol/L) + $H_3BO_3$ (0.5 mol/L) |
| | Sulfamic acid bath: $Ni(S_2NH_2)_2$ (1.0 mol/L) + $H_3BO_3$ (0.5 mol/L) |
| Ag—Sn | AgI (0.02 mol/L) + $SnCl_2 \cdot 2H_2O$ (0.18 mol/L) + KI (2 mol/L) + $K_4P_2O_7$ (0.54 mol/L) |
| Cu—Sn | $SnSO_4$ (X mol/L) + $CuSO_4$ (0.5-X mol/L) + $H_2SO_4$ (1 mol/L) + Cresolsulfonic acid (0.25 mol/L) |

BRIEF DESCRIPTION OF DRAWINGS

FIG. 4(a) shows a transmission electron microscope image of a crystal grain in a film in which agarose gel is filled in copper with electron beam incidence orientation <211> and FIG. 4(b) shows a transmission electron microscope image of a crystal grain in a film in which agarose gel is filled in copper with electron beam incidence orientation <011>.

BRIEF DESCRIPTION OF REFERENCE NUMERALS

Figure 1:
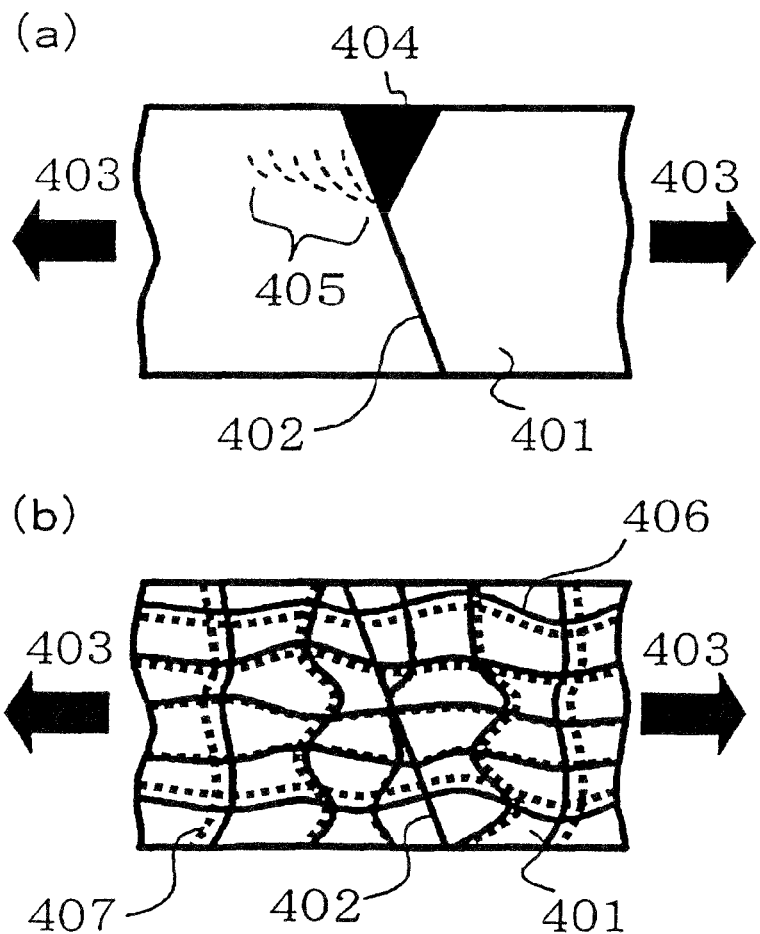
FIG. 1 is a schematic cross-sectional view for explaining action of metallic material of the embodiment.
Figure 2:
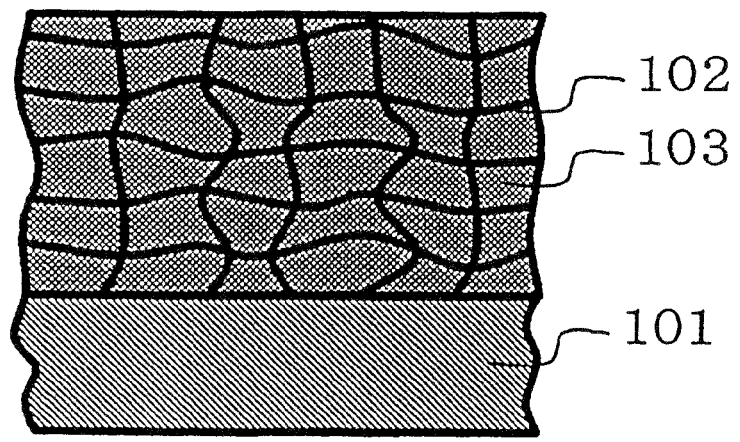
FIG. 2 is a schematic cross-sectional view for explaining a constitution of metallic material of the embodiment.
Figure 3:
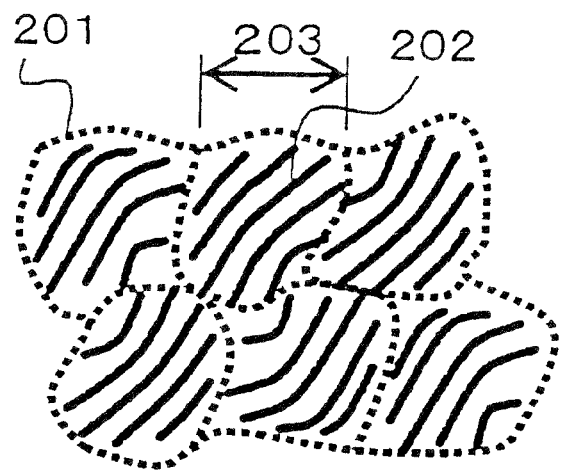
FIG. 3 is a schematic diagram showing an example of metallic material of the embodiment.
Figure 4:
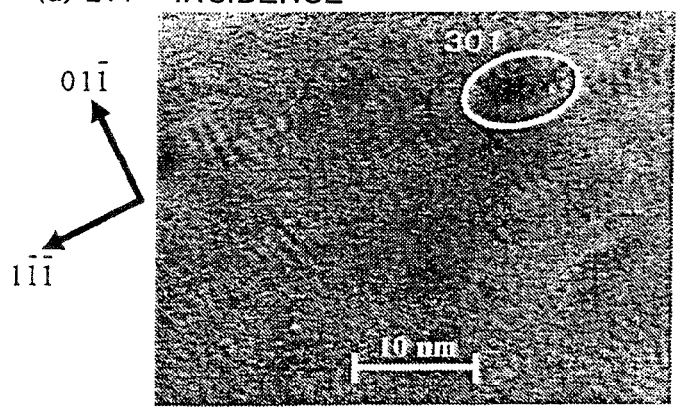
FIG. 4 is a transmission electron microscope image showing a specific example of metallic material of the embodiment.
Figure 4:
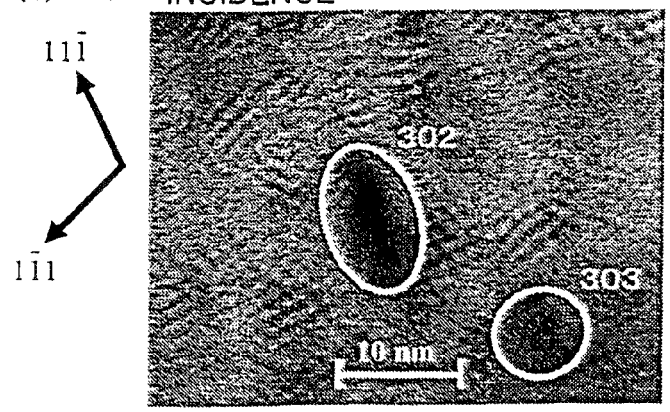

| | |
|---|---|
| 101 | Substrate |
| 102 | Gel (three-dimensional) mesh structure |
| 103 | Metal |
| 201 | Gel network (observation is difficult) |
| 202 | Subdivided moiré patterns |
| 203 | Size of subdivided areas of moiré patterns |
| 301 | Dislocation contrast |
| 302 | Dislocation contrast |
| 303 | Dislocation contrast |
| 401 | Metal |
| 402 | Grain interface |
| 403 | Tensile stress |
| 404 | Void |
| 405 | Dislocation |
| 406 | Gel mesh structure (solid line) |
| 407 | Gel mesh structure (broken line) |

The invention claimed is:

1. A metallic material characterized by comprising, in a transmission electron microscope image, crystal grains observed to be filled up with moiré patterns that are amorphously subdivided and that have variable intervals and angles.

2. The metallic material in accordance with claim 1, characterized by comprising
crystal grains providing moiré patterns whose intervals are equal to or less than ten nanometers.

3. The metallic material in accordance with claim 1, characterized by comprising
crystal grains including subdivided areas of moiré patterns, the subdivided areas having a mean size equal to or less than 50 nm.

4. The metallic material in accordance with claim 1, characterized by comprising
a structure in which metal is densely filled in gaps in a network structure of gel.

5. The metallic material in accordance with claim 1, characterized by comprising
copper as a base thereof.

6. Wiring for semiconductor integrated circuits, comprising metallic material that includes, in a transmission electron microscope image, crystal grains observed to be filled up with moiré patterns that are amorphously subdivided and that have variable intervals and angles.

7. The wiring for semiconductor integrated circuits according to claim 6, wherein the metallic material includes crystal grains providing moiré patterns whose intervals are equal to or less than ten nanometers.

8. The wiring for semiconductor integrated circuits according to claim 6, wherein the metallic material includes crystal grains including subdivided areas of moiré patterns, the subdivided areas having a mean size equal to or less than 50 nm.

9. The wiring for semiconductor integrated circuits according to claim 6, wherein the metallic material includes a structure in which metal is densely filled in gaps in a network structure of gel.

10. The wiring for semiconductor integrated circuits according to claim 6, wherein the metallic material includes copper as a base thereof.

11. A coating film for electric tools, mechanical parts, or optical parts, comprising the metallic material that includes, in a transmission electron microscope image, crystal grains observed to be filled up with moiré patterns that are amorphously subdivided and that have variable intervals and angles.

12. The coating film according to claim 11, wherein the metallic material includes crystal grains providing moiré patterns whose intervals are equal to or less than ten nanometers.

13. The coating film according to claim 11, wherein the metallic material includes crystal grains including subdivided areas of moiré patterns, the subdivided areas having a mean size equal to or less than 50 nm.

14. The coating film according to claim 11, wherein the metallic material includes a structure in which metal is densely filled in gaps in a network structure of gel.

15. The coating film according to claim 11, wherein the metallic material includes copper as a base thereof.

* * * * *